United States Patent
Kosaka

(10) Patent No.: US 9,897,911 B2
(45) Date of Patent: Feb. 20, 2018

(54) HALFTONE PHASE SHIFT PHOTOMASK BLANK, MAKING METHOD, AND HALFTONE PHASE SHIFT PHOTOMASK

(71) Applicant: Shin-Etsu Chemical Co., Ltd., Tokyo (JP)

(72) Inventor: Takuro Kosaka, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 59 days.

(21) Appl. No.: 15/232,365

(22) Filed: Aug. 9, 2016

(65) Prior Publication Data

US 2017/0059983 A1   Mar. 2, 2017

(30) Foreign Application Priority Data

Aug. 31, 2015 (JP) .................................. 2015-170367
Jun. 13, 2016 (JP) .................................. 2016-116794

(51) Int. Cl.
| | | |
|---|---|---|
| G03F 1/32 | (2012.01) | |
| G03F 1/26 | (2012.01) | |
| G03F 1/80 | (2012.01) | |
| C23C 14/06 | (2006.01) | |
| G03F 7/20 | (2006.01) | |
| C23C 14/00 | (2006.01) | |
| C23C 14/34 | (2006.01) | |

(52) U.S. Cl.
CPC ............ *G03F 1/32* (2013.01); *C23C 14/0036* (2013.01); *C23C 14/0676* (2013.01); *C23C 14/3464* (2013.01); *G03F 1/26* (2013.01); *G03F 1/80* (2013.01); *G03F 7/70783* (2013.01)

(58) Field of Classification Search
CPC ..... G03F 1/26; G03F 1/32; G03F 1/80; G03F 7/70783; C23C 14/0036; C23C 14/0676; C23C 14/3464
USPC ............................................................ 430/5
See application file for complete search history.

(56) References Cited

U.S. PATENT DOCUMENTS

| | | |
|---|---|---|
| 6,743,553 B2 | 6/2004 | Shiota et al. |
| 7,115,341 B2 | 10/2006 | Shiota et al. |
| 7,632,612 B2 | 12/2009 | Shiota et al. |

FOREIGN PATENT DOCUMENTS

| | | |
|---|---|---|
| JP | 2003-280168 A | 10/2003 |
| JP | 2006-78953 A | 3/2006 |

*Primary Examiner* — Christopher G Young
(74) *Attorney, Agent, or Firm* — Birch, Stewart, Kolasch & Birch, LLP

(57) ABSTRACT

A halftone phase shift photomask blank is provided comprising a transparent substrate and a halftone phase shift film thereon having a phase shift of 150-200° and a transmittance of 9-40%. The halftone phase shift film consists of a transition metal, Si, O and N, has an average transition metal content of at least 3 at %, and is composed of a plurality of layers including a stress relaxation layer having an oxygen content of at least 3 at % and a phase shift adjusting layer having a higher oxygen content of at least 5 at %.

14 Claims, 1 Drawing Sheet

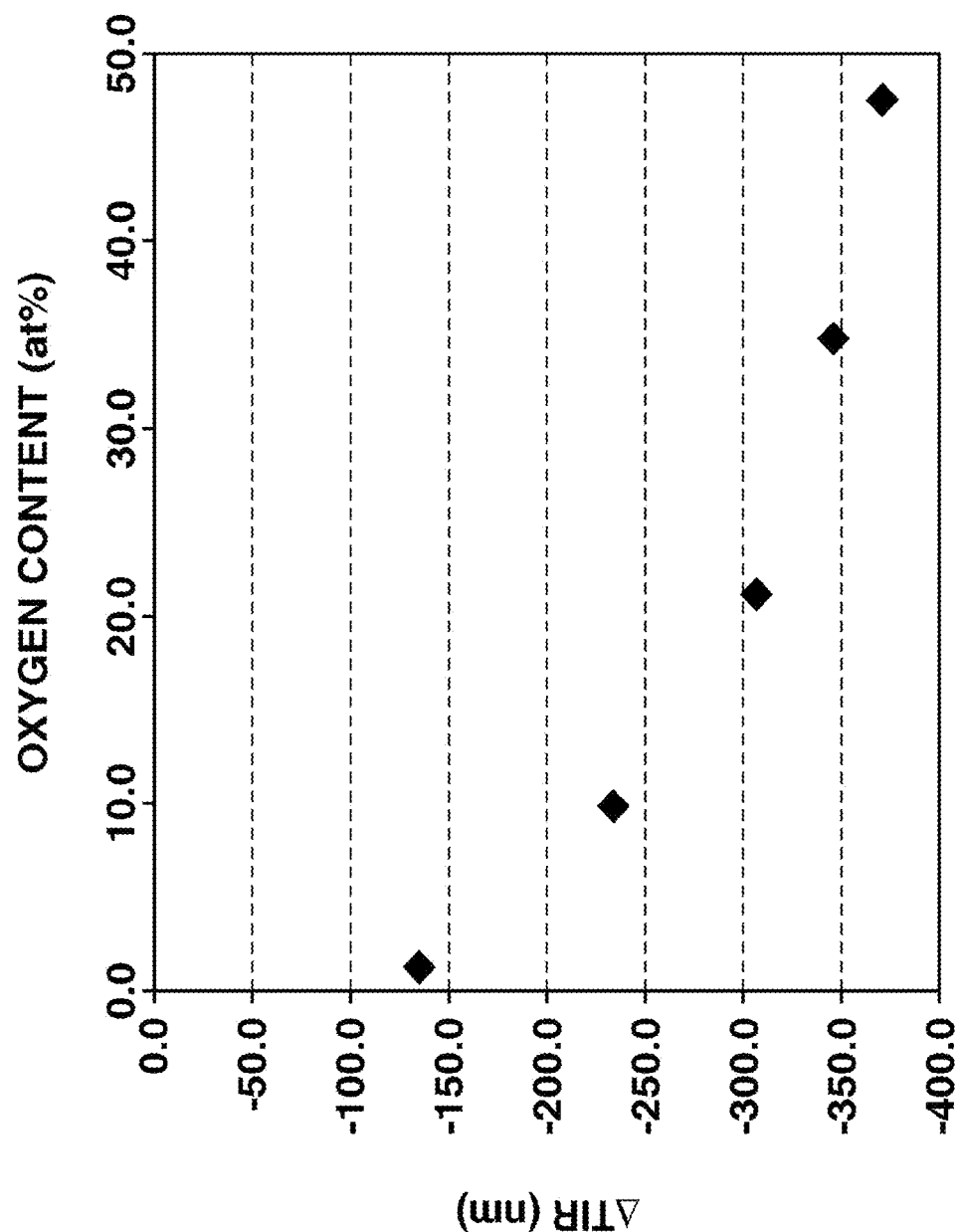

HALFTONE PHASE SHIFT PHOTOMASK BLANK, MAKING METHOD, AND HALFTONE PHASE SHIFT PHOTOMASK

CROSS-REFERENCE TO RELATED APPLICATION

This non-provisional application claims priority under 35 U.S.C. § 119(a) on Patent Application Nos. 2015-170367 and 2016-116794 filed in Japan on Aug. 31, 2015 and Jun. 13, 2016, respectively, the entire contents of which are hereby incorporated by reference.

TECHNICAL FIELD

This invention relates to a halftone phase shift photomask blank and a halftone phase shift photomask for use in the microfabrication of semiconductor integrated circuits or the like.

BACKGROUND ART

As the photomask technology advances toward further miniaturization, the pattern feature width becomes smaller than the exposure wavelength. Use is now made of the resolution enhancement technology (RET) such as optical proximity correction (OPC), modified illumination, immersion lithography, phase shift method, and double exposure lithography. In particular, the phase shift method has heretofore utilized halftone phase shift films having a transmittance of about 6%. To form a pattern of narrower width, for example, to form a pattern with a half pitch of up to 50 nm by photolithography, a halftone phase shift film having a higher transmittance is necessary for gaining a higher contrast ratio. Specifically a halftone phase shift film having a phase shift of about 180° and a transmittance of 9% to 40% is required.

CITATION LIST

Patent Document 1: JP-A 2006-078953
Patent Document 2: JP-A 2003-280168

DISCLOSURE OF INVENTION

Among halftone phase shift photomask blanks with high transmittance, halftone phase shift photomask blanks having a halftone phase shift film consisting of silicon and nitrogen, or silicon, oxygen and nitrogen are under study because thinning of the film and improvement in cleaning resistance of the film are expectable. However, during the step of processing from photomask blanks to photomasks, this halftone phase shift film has disadvantages including a slow etching rate of fluorine base dry etching and extreme difficulty of defect correction.

The photomask blanks are improved in processability by adding a transition metal to the halftone phase shift film. The addition of transition metal to the film tends to reduce its transmittance. To obtain a halftone phase shift film with a high transmittance, not only nitrogen, but also a certain amount of oxygen must be added. However, when a high-transmittance halftone phase shift film consisting of transition metal, silicon, oxygen and nitrogen is formed as a monolayer film, a problem of increased film stress arises. Since the film stress is relieved after processing of photomask blanks to photomasks, the increased film stress causes a lowering of positional accuracy of a pattern formed in the film. Particularly when a halftone phase shift film is deposited as monolayer film by sputtering, which is commonly used in the deposition of halftone phase shift films, sputtering is performed by setting the feed rate of reactive gas into the chamber very high in accordance with the predetermined film composition. Then, film deposition under a low chamber pressure is difficult although it is believed that a low setting of the chamber pressure is effective for relieving film stress. It is quite difficult to keep the film stress low by adjusting film deposition conditions including chamber pressure.

The invention pertains to a halftone phase shift photomask blank having a halftone phase shift film consisting of transition metal, silicon, oxygen and nitrogen and having a high transmittance. An object of the invention is to provide a halftone phase shift photomask blank having a halftone phase shift film which is low stressed and easy to process and maintains the predetermined phase shift; a method for preparing the same; and a halftone phase shift photomask.

Regarding a halftone phase shift photomask blank having a halftone phase shift film consisting of transition metal, silicon, oxygen and nitrogen and having a high transmittance, the inventors have found that when a halftone phase shift film is constructed by a plurality of layers including a stress relaxation layer having a low oxygen content and a phase shift adjusting layer having a high oxygen content, the resulting halftone phase shift film offers a high transmittance and a predetermined phase shift with respect to exposure light, and a high accuracy of processing. Where the halftone phase shift film is constructed from such plural layers, the stress relaxation layer tends to have a low transmittance on the longer wavelength side than the wavelength of exposure light, typically on the infrared side, and the stress relaxation layer is increased in absorption efficiency of irradiated light in the optical anneal treatment such as flash lamp anneal. Then the halftone phase shift film of multilayer structure including stress relaxation layer and phase shift adjusting layer is advantageous in film stress relief by optical anneal treatment.

In one aspect, the invention provides a halftone phase shift photomask blank comprising a transparent substrate and a halftone phase shift film thereon providing a phase shift of 150° to 200° and a transmittance of 9% to 40% with respect to light of wavelength up to 200 nm. The halftone phase shift film consists of a transition metal, silicon, oxygen and nitrogen, has an average transition metal content of at least 3 at %, and is composed of a plurality of layers including at least one stress relaxation layer consisting of the transition metal, silicon, oxygen and nitrogen and at least one phase shift adjusting layer consisting of the transition metal, silicon, oxygen and nitrogen. The stress relaxation layer has an oxygen content of at least 3 at % which is the lowest, and the phase shift adjusting layer has an oxygen content of at least 5 at % which is at least 2 at % higher than the oxygen content of the stress relaxation layer.

In a preferred embodiment, the halftone phase shift film is formed contiguous to the transparent substrate.

In a preferred embodiment, a layer disposed closest to the transparent substrate is the stress relaxation layer.

In a preferred embodiment, the halftone phase shift film consists of at least three layers, and each of the phase shift adjusting layers is disposed contiguous to any stress relaxation layer.

In a preferred embodiment, the transition metal content is in a range of 5 at % to 10 at %.

Typically, the transition metal is molybdenum.

In a preferred embodiment, the halftone phase shift film has a transmittance of 9% to 12% or a transmittance of 15% to 30%.

The photomask blank is processed into a halftone phase shift photomask, the photomask being suited for use in photolithography for forming a pattern with a half pitch of up to 50 nm on a processable substrate, and in the patternwise exposure step for transferring the pattern to a photoresist film formed on the processable substrate using exposure light of wavelength up to 200 nm.

In another aspect, the invention provides a method for preparing a halftone phase shift photomask blank comprising a transparent substrate and a halftone phase shift film thereon providing a phase shift of 150° to 200° and a transmittance of 9% to 40% with respect to light of wavelength up to 200 nm, the method comprising the step of forming a halftone phase shift film on the transparent substrate, the halftone phase shift film consisting of a transition metal, silicon, oxygen and nitrogen, having an average transition metal content of at least 3 at %, and being composed of a plurality of layers including at least one stress relaxation layer consisting of the transition metal, silicon, oxygen and nitrogen and at least one phase shift adjusting layer consisting of the transition metal, silicon, oxygen and nitrogen, the stress relaxation layer having an oxygen content of at least 3 at % which is the lowest, the phase shift adjusting layer having an oxygen content of at least 5 at % which is at least 2 at % higher than the oxygen content of the stress relaxation layer.

In a preferred embodiment, the halftone phase shift film has a transmittance of 9% to 12%, and the method further includes the step of irradiating pulse of infrared-containing light to the halftone phase shift film on the substrate.

In a preferred embodiment, the method further comprises the step of heat treating the halftone phase shift film on the substrate by holding at 250 to 600° C. for at least 2 hours prior to the step of pulse irradiation of infrared-containing light.

In another preferred embodiment, the halftone phase shift film has a transmittance of 15% to 30%, and the method further includes the step of heat treating the halftone phase shift film on the substrate by holding at 250 to 600° C. for at least 2 hours, but not the step of pulse irradiation of infrared-containing light.

In a further aspect, the invention provides a halftone phase shift photomask comprising a transparent substrate and a halftone phase shift film thereon providing a phase shift of 150° to 200° and a transmittance of 9% to 40% with respect to light of wavelength up to 200 nm, wherein the halftone phase shift film consists of a transition metal, silicon, oxygen and nitrogen, has an average transition metal content of at least 3 at %, and is composed of a plurality of layers including at least one stress relaxation layer consisting of the transition metal, silicon, oxygen and nitrogen and at least one phase shift adjusting layer consisting of the transition metal, silicon, oxygen and nitrogen, the stress relaxation layer has an oxygen content of at least 3 at % which is the lowest, the phase shift adjusting layer has an oxygen content of at least 5 at % which is at least 2 at % higher than the oxygen content of the stress relaxation layer.

Advantageous Effects of Invention

Among halftone phase shift photomask blanks having a halftone phase shift film consisting of transition metal, silicon, oxygen and nitrogen and having a high transmittance, the invention provides a halftone phase shift photomask blank (and halftone phase shift photomask) having a halftone phase shift film which is low stressed and improved in processability while maintaining a predetermined phase shift. Using the halftone phase shift mask, lithography exposure complying with the requirements of pattern miniaturization and patterning accuracy becomes possible.

BRIEF DESCRIPTION OF DRAWINGS

The only FIGURE, FIG. 1 is a diagram showing ΔTIR versus oxygen content of the halftone phase shift film in Experiment 1.

DESCRIPTION OF PREFERRED EMBODIMENTS

The invention pertains to a halftone phase shift photomask blank comprising a transparent substrate, typically quartz substrate and a halftone phase shift film deposited thereon and composed of a transition metal, silicon, oxygen and nitrogen.

The halftone phase shift film has a transmittance of at least 9% and up to 40%, especially up to 30% with respect to light (or exposure light) of wavelength up to 200 nm such as ArF excimer laser (wavelength 193 nm) or $F_2$ laser (wavelength 157 nm), specifically a high transmittance as compared with conventional transition metal-containing halftone phase shift films. A film having a transmittance in excess of 40% contains a high level of stress which may not be fully relieved by heat treatment to be described later.

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light at the boundary whereby contrast is increased. Specifically the phase shift is from 150 degrees to 200 degrees. Although ordinary phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably at least 160°, more preferably at least 175° and up to 190°, more preferably up to 185°, and most preferably approximately 180°.

The halftone phase shift film is a film of multilayer structure comprising a plurality of layers including a stress relaxation layer consisting of the transition metal, silicon, oxygen and nitrogen and a phase shift adjusting layer consisting of the transition metal, silicon, oxygen and nitrogen. The number of layers is typically four or less, though not particularly limited.

The stress relaxation layer is a layer having the lowest oxygen content among the multiple layers. The phase shift adjusting layer is a layer having an oxygen content which is higher than the oxygen content of the stress relaxation layer by at least 2 at %, preferably at least 5 at %, more preferably at least 10 at %, and even more preferably at least 15 at %. Differently stated, among plural layers which constitute the halftone phase shift film, a layer having the lowest oxygen content is the stress relaxation layer and other layers are phase shift adjusting layers having a higher oxygen content than the stress relaxation layer. When the halftone phase shift film is composed of a plurality of layers including a stress relaxation layer and a phase shift adjusting layer, the overall halftone phase shift film is reduced in film stress as compared with a halftone phase shift film of monolayer structure. Then the accuracy at which a halftone phase shift film is processed into a film pattern is improved.

The stress relaxation layer may be composed of a single layer or multiple layers. It is noted that the term "multiple" means two or more. Where the stress relaxation layer is composed of multiple layers, the stress relaxation layers should have an identical oxygen content. The stress relaxation layers may be different in all of transition metal, silicon and nitrogen contents, but are preferably identical in some or all of transition metal, silicon and nitrogen contents. Where the stress relaxation layer is composed of multiple layers, the stress relaxation layers may be either identical or different in thickness. On the other hand, where the phase shift adjusting layer is composed of multiple layers, the phase shift adjusting layers may be different in all of transition metal, silicon, oxygen and nitrogen contents, or may be identical in some or all of transition metal, silicon, oxygen and nitrogen contents. Where the phase shift adjusting layer is composed of multiple layers, the phase shift adjusting layers may be either identical or different in thickness.

Although the halftone phase shift film may be deposited on the transparent substrate via another film, for example, an optical film (e.g., light-shielding film or antireflective film), an auxiliary processing film (e.g., etching mask film or etching stop film) or conductive film, the halftone phase shift film is preferably deposited contiguous to the transparent substrate (without any intervening layer). On the surface of the halftone phase shift film disposed remote from the substrate, another film, for example, an optical film (e.g., light-shielding film or antireflective film), an auxiliary processing film (e.g., etching mask film or etching stop film), conductive film or resist film may be formed.

Among the stress relaxation layer and phase shift adjusting layer which constitute the halftone phase shift film, preferably the stress relaxation layer (in case of monolayer, that layer or in case of multiple layers, any one layer) is formed closest to the substrate, especially contiguous to the substrate. The arrangement of the stress relaxation layer contiguous to the substrate allows for efficient relaxation of the film stress in a substrate-adjoining portion caused by the substrate, succeeding in further reducing the film stress of the overall halftone phase shift film as compared with a halftone phase shift film of monolayer structure. Then the accuracy at which a halftone phase shift film is processed into a film pattern is further improved.

Exemplary of the halftone phase shift film of the above construction are a halftone phase shift film of two-layer structure including a stress relaxation layer and a phase shift adjusting layer stacked in order from the substrate side, a halftone phase shift film of three-layer structure including a stress relaxation layer and two phase shift adjusting layers stacked in order from the substrate side, and a halftone phase shift film of three-layer structure including a stress relaxation layer, a phase shift adjusting layer and a stress relaxation layer stacked in order from the substrate side. The halftone phase shift film having a stress relaxation layer disposed contiguous to the substrate has less film stress than a halftone phase shift film of monolayer structure having the same transmittance, phase shift and thickness, and is especially effective because a higher film stress relieving effect is achieved by heat treatment and/or pulse irradiation of IR-containing light, which will be described later. Also, among the stress relaxation layer and phase shift adjusting layer which constitute the halftone phase shift film, preferably the stress relaxation layer is formed on the outermost side (remotest from the substrate), especially in the case of two-layer structure, the phase shift adjusting layer and stress relaxation layer are stacked in order from the substrate side because this arrangement is effective for increasing reflectance from the surface side of the halftone phase shift film and for increasing defect detection sensitivity.

In the embodiment wherein the halftone phase shift film is composed of three or more layers, preferably each phase shift adjusting layer (in case of monolayer, that layer or in case of multiple layers, all layers) is deposited contiguous to any stress relaxation layer, and more preferably stress relaxation layers and phase shift adjusting layers are alternately deposited. The arrangement of the phase shift adjusting layer contiguous to the stress relaxation layer allows for efficient relaxation of film stress from the phase shift adjusting layer (containing more film stress than the stress relaxation layer), succeeding in further reducing the film stress of the overall halftone phase shift film as compared with a halftone phase shift film of monolayer structure. Then the accuracy at which a halftone phase shift film is processed into a film pattern is further improved.

Exemplary of the halftone phase shift film of the above construction are a halftone phase shift film of three-layer structure including a phase shift adjusting layer, a stress relaxation layer and a phase shift adjusting layer stacked in order from the substrate side, a halftone phase shift film of four-layer structure including a stress relaxation layer, two phase shift adjusting layers and a stress relaxation layer stacked in order from the substrate side, and a halftone phase shift film of four-layer structure including stress relaxation layers and phase shift adjusting layers stacked alternately in order or reverse order from the substrate side. The halftone phase shift film including alternately stacked stress relaxation layers and phase shift adjusting layers, for example, halftone phase shift film of three-layer structure including phase shift adjusting layer/stress relaxation layer/phase shift adjusting layer stacked in order from the substrate side has less film stress than a halftone phase shift film of monolayer structure having the same transmittance, phase shift and thickness, and is especially effective because a higher film stress relieving effect is achieved by heat treatment and/or pulse irradiation of IR-containing light, which will be described later.

The halftone phase shift film is a film consisting of a transition metal, silicon, oxygen and nitrogen, i.e., a film of transition metal silicon oxynitride. However, inclusion of elements other than these is permissible as long as their amount is at an impurity level. In order that the halftone phase shift film have a high transmittance of at least 9% and be amenable to processing, the halftone phase shift film should have an average transition metal content of at least 3 at %, preferably at least 5 at %. The average transition metal content is preferably up to 10 at %, more preferably up to 8 at %, and even more preferably up to 7 at %. A film with an average transition metal content in excess of 10 at % may be poor in cleaning resistance and resistance to irradiation of exposure light.

Also, the halftone phase shift film should preferably have an average silicon content of at least 30 at %, preferably at least 33 at % and up to 45 at %, more preferably up to 40 at % and an average oxygen content of at least 10 at %, preferably at least 12 at % and up to 45 at %, more preferably up to 40 at %. The average content of nitrogen is substantially the balance. It is noted that the average content of an element in a halftone phase shift film corresponds to a percent by atom of the total amount of that element based on the total amount of atoms in all layers of the film.

For each of the layers constituting the halftone phase shift film, the contents of transition metal, silicon, oxygen and nitrogen are as follows. For either of the stress relaxation layer and the phase shift adjusting layer, the transition metal content is preferably at least 3 at %, especially at least 5 at %, and up to 10 at %, especially up to 7 at %; and the silicon content is preferably at least 30 at %, especially at least 33 at %, and up to 45 at %, especially up to 40 at %. The oxygen content is preferably at least 5 at %, especially at least 10 at %, and up to 35 at %, more preferably up to 30 at %, especially up to 20 at % for the stress relaxation layer; and preferably at least 7 at %, especially at least 12 at %, and up to 60 at %, more preferably up to 50 at %, especially up to 40 at % for the phase shift adjusting layer. The average content of nitrogen is substantially the balance.

In the practice of the invention, a stress relaxation layer having an oxygen content which is at least 2 at % lower than the oxygen content of the phase shift adjusting layer is applied. This allows the stress relaxation layer to exert a full function for reducing the film stress in the halftone phase shift film. In the embodiment wherein the halftone phase shift film has an average oxygen content of at least 26 at %, especially all layers of the halftone phase shift film have an oxygen content of at least 26 at %, since such a high oxygen content has a greater impact on the increase of film stress, the difference in oxygen content between the stress relaxation layer and the phase shift adjusting layer is preferably set at least 10 at %, more preferably at least 15 at %.

If the thickness of the stress relaxation layer (total thickness of multiple layers when a stress relaxation layer is composed of multiple layers) is too thin relative to the overall thickness of the halftone phase shift film, a sufficient reduction of film stress by the stress relaxation layer is not expectable. If the thickness is too thick relative to the overall thickness of the halftone phase shift film, the phase shift adjusting layer must be given a higher oxygen content in order to acquire the predetermined high transmittance. As a result, film stress is rather increased; or since stress relaxation layers having a low oxygen content account for a higher proportion, the oxygen content of the overall halftone phase shift film is not fully increased, failing to acquire the predetermined high transmittance. For the above reason, the thickness of the stress relaxation layer is preferably at least 5%, more preferably at least 10%, and up to 50%, more preferably up to 30% of the overall thickness of the halftone phase shift film.

The halftone phase shift photomask blank may be prepared by depositing a halftone phase shift film including a stress relaxation layer and a phase shift adjusting layer on a transparent substrate, and optionally depositing another film between the substrate and the halftone phase shift film and/or on the side of the halftone phase shift film disposed remote from the substrate, by any well-known methods.

Preferably the halftone phase shift film is deposited by reactive sputtering. Specifically, a transparent substrate is set in a sputtering chamber. Sputter deposition may be performed by using a transition metal target, transition metal-silicon target and silicon target as the target, feeding reactive gases such as oxygen ($O_2$) gas, nitrogen ($N_2$) gas and nitrogen oxide ($N_2O$, $NO_2$) gas and a rare gas such as argon (Ar) gas as the sputtering gas, and adjusting the power across the target and the flow rate of sputtering gas in accordance with the composition of a stress relaxation layer or phase shift adjusting layer to be deposited. Sputtering conditions are changed in sequence in accordance with the stacking order and number of stress relaxation layers and phase shift adjusting layers. The sputtering time is selected in accordance with the thickness of the respective layers. In this way, a halftone phase shift film of multilayer construction including a stress relaxation layer and a phase shift adjusting layer may be deposited. The sputtering pressure is preferably in a range of 0.01 Pa to 0.5 Pa.

The halftone phase shift film deposited on the transparent substrate is preferably heat treated by holding at a temperature of at least 250° C., especially at least 300° C. and up to 600° C., especially up to 500° C. for at least 2 hours, especially at least 4 hours. The heat treatment is effective for relieving the stress from the halftone phase shift film. The heat treatment may be performed by accommodating the substrate having the halftone phase shift film deposited thereon in a heat treating furnace, typically electric furnace, and heating at a predetermined temperature for a predetermined time. The heat treatment may be performed either before or after another film is formed on the side of the halftone phase shift film disposed remote from the substrate. The duration of heat treatment is typically up to 6 hours when the film stress relieving effect and productivity are taken into account, though not critical.

Further, the halftone phase shift film deposited on the transparent substrate is preferably subjected to pulse irradiation of light containing infrared (IR). The pulse irradiation of IR-containing light is effective for relieving the stress from the halftone phase shift film. The effect is enhanced by combining the pulse irradiation treatment with the heat treatment. By performing heat treatment prior to pulse irradiation treatment, the effect of relieving film stress becomes the highest. The pulse irradiation treatment may be performed either before or after another film is formed on the side of the halftone phase shift film disposed remote from the substrate. It is preferred to perform pulse irradiation treatment before another film is formed on the side of the halftone phase shift film disposed remote from the substrate, because light can be irradiated directly to the halftone phase shift film.

The preferred light source for emitting pulse of IR-containing light is a flash lamp. The flash lamp is a light source providing short duration pulse of light in a continuous broad wavelength region, for example, a lamp including a bulb of light-transmissive material, typically glass filled with a gas such as xenon gas, across which high voltage is applied in pulse for light emission. The amount of energy applied to the film by pulse irradiation treatment, which varies with the film composition, is preferably at least 15 $J/cm^2$, especially at least 20 $J/cm^2$ and up to 35 $J/cm^2$, especially up to 30 $J/cm^2$ as accumulative dose.

The pulse irradiation treatment with IR-containing light is effective particularly on the halftone phase shift film having a transmittance in the range of 9% to 12%. For the halftone phase shift film having a transmittance in excess of 12%, the effect of reducing film stress per irradiation energy unit becomes weaker. If a larger amount of energy is irradiated to compensate for such a loss of the effect, it is uneconomical and gives rise to the problems that the film is contaminated by introduction of materials originating from the irradiation system and film quality is altered by such contaminants. Then, for the halftone phase shift film having a transmittance in excess of 12%, specifically of at least 15% and up to 50%, especially up to 30%, it is recommended that only the heat treatment be performed and the pulse irradiation treatment with IR-containing light be omitted.

The transition metal of which the halftone phase shift film is constructed, that is, the stress relaxation layer and phase shift adjusting layer are constructed, and the transition metal of which the target used in deposition of the halftone phase shift film is constructed is typically selected from molybdenum, zirconium, tungsten, titanium, hafnium, chromium and tantalum. One or more elements selected from these transition metals may be used, with molybdenum being most preferred.

The halftone phase shift photomask of the invention is defined as comprising a transparent substrate and a pattern of a halftone phase shift film formed thereon including a stress relaxation layer and a phase shift adjusting layer as described above. The photomask may be prepared from the halftone phase shift photomask blank defined above by pattering the halftone phase shift film by any of well-known techniques which are applied to the patterning of films on photomask blanks. For example, if necessary, a resist film is deposited on the halftone phase shift photomask blank, and the resist film is patterned by the standard technique. With the resist film pattern made etching mask, the underlying film is patterned by dry etching. Further, if necessary, with the resist film pattern and the film pattern made etching mask, the further underlying film, if any, and the transparent substrate are patterned in sequence by dry etching. Finally the unnecessary film(s) is removed, yielding a halftone phase shift photomask. Although the dry etching may be selected from chlorine-base, fluorine-base and other dry etching techniques depending on the film composition, fluorine-base dry etching is typically selected for the halftone phase shift film according to the invention.

In a photolithographic method for forming a pattern with a half pitch of up to 50 nm, typically up to 30 nm, and more typically up to 20 nm on a processable substrate, comprising the steps of forming a photoresist film on the processable substrate and exposing the photoresist film to light of wavelength up to 200 nm, typically ArF excimer laser (193 nm) or $F_2$ laser (157 nm), through a patterned mask for transferring the pattern to the photoresist film, the halftone phase shift photomask (prepared from the halftone phase shift photomask blank of the invention) is best suited for use in the exposure step.

The method for patternwise exposure through the halftone phase shift photomask (prepared from the halftone phase shift photomask blank of the invention) involves the steps of forming a photoresist film on a processable substrate, setting in place the halftone phase shift photomask bearing a photomask pattern including a halftone phase shift film pattern, and irradiating exposure light to the photomask pattern for thereby transferring the photomask pattern to the photoresist film on the processable substrate. The irradiation of exposure light may be either dry exposure or liquid immersion exposure. The halftone phase shift photomask of the invention is effective particularly in the exposure of a resist film on a processable substrate in the form of a wafer with a size of at least 300 mm to a photomask pattern of light by the immersion lithography having the tendency that an accumulative irradiated energy amount sharply increases within a relatively short time in the commercial application.

EXAMPLE

Examples are given below for further illustrating the invention although the invention is not limited thereto.

Experiment 1

In a chamber of a sputtering system, a 6025 quartz substrate of 152 mm squares and 6.35 mm thick was set. Five halftone phase shift films of MoSiON were deposited on the substrates by using MoSi and Si targets as the sputtering target, argon, nitrogen and oxygen gases as the sputtering gas, applying a constant power of 300 W across the MoSi target and a constant power of 1,700 W across the Si target, feeding argon gas at a constant flow rate of 18 sccm, nitrogen gas at a constant flow rate of 65 sccm, and oxygen gas at different flow rates of 0, 3, 6, 10 and 15 sccm. The deposition was adjusted such that the films might have a phase shift of 177° with respect to light of wavelength 193 nm (ArF excimer laser, same hereinafter).

The halftone phase shift films as deposited were measured for TIR (total indicator reading) by a flatness tester (Ultra-Flat Type-G, Corning Tropel). Notably, the same applies to TIR measurement hereinafter. A difference of TIR (ΔTIR) was obtained by subtracting the TIR value as deposited from the TIR value measured prior to deposition (that is, of the quartz substrate) and reported as an index of film stress. For the halftone phase shift films deposited under different conditions, ΔTIR is plotted as a function of oxygen content in the diagram of FIG. 1. It is evident from FIG. 1 that a film having a lower oxygen content contains a lower stress per unit phase shift.

Example 1

In a chamber of a sputtering system, a 6025 quartz substrate of 152 mm squares and 6.35 mm thick was set. A halftone phase shift film of MoSiON was deposited on the substrate by using MoSi and Si targets as the sputtering target, argon, nitrogen and oxygen gases as the sputtering gas, applying a constant power of 300 W across the MoSi target and a constant power of 1,700 W across the Si target, feeding argon gas at a constant flow rate of 18 sccm, nitrogen gas at a constant flow rate of 65 sccm, and oxygen gas at different flow rates of 6.6, 13.6 and 17.6 sccm. The halftone phase shift film was of three-layer structure including a stress relaxation layer (28 nm thick), a first phase shift adjusting layer (43 nm thick) and a second phase shift adjusting layer (42 nm thick) stacked in order from the substrate side. The halftone phase shift film as deposited was measured for TIR. A TIR difference (ΔTIR) obtained by subtracting the TIR value as deposited from the TIR value measured prior to deposition (that is, of the quartz substrate) was −0.30 μm.

The transparent substrate having the halftone phase shift film deposited thereon was heat treated in a heating furnace at 300° C. for 6 hours. A TIR value after heat treatment was measured. A TIR difference (STIR) obtained by subtracting the TIR value after heat treatment from the TIR value measured prior to deposition (that is, of the quartz substrate) was −0.25 μm.

Using a flash lamp annealing system LA3020F (Screen Holdings Co., Ltd.), the halftone phase shift film after heat treatment was subjected to pulse irradiation of IR-containing light under such conditions as to provide an irradiation energy dose of 29.1 J/cm$^2$ (determined by previous measurement by a colorimeter, same hereinafter), to complete a halftone phase shift photomask blank. The photomask blank was measured for a TIR value after pulse irradiation treatment. A TIR difference (ΔTIR) obtained by subtracting the TIR value after pulse irradiation treatment from the TIR value measured prior to deposition (that is, of the quartz substrate) was −0.24 μm.

The halftone phase shift film had a transmittance of 30% and a phase shift of 177° with respect to the exposure light, and a thickness of 113 nm. The stress relaxation layer had a molybdenum content of 4.2 at %, a silicon content of 35.9 at %, an oxygen content of 31.8 at %, and a nitrogen content of 28.1 at %; the first phase shift adjusting layer had a molybdenum content of 3.5 at %, a silicon content of 32.6 at %, an oxygen content of 49.1 at %, and a nitrogen content of 14.8 at %; the second phase shift adjusting layer had a molybdenum content of 3.2 at %, a silicon content of 31.5 at %, an oxygen content of 57.1 at %, and a nitrogen content of 8.2 at %. The overall halftone phase shift film had on average a molybdenum content of 3.6 at %, a silicon content of 33.0 at %, an oxygen content of 47.8 at %, and a nitrogen content of 15.6 at %. The deposition conditions, film composition, irradiation energy, ΔTIR, film thickness, transmittance, and phase shift are tabulated in Table 1.

Comparative Example 1

In a chamber of a sputtering system, a 6025 quartz substrate of 152 mm squares and 6.35 mm thick was set. A halftone phase shift film of MoSiON monolayer structure was deposited on the substrate by using MoSi and Si targets as the sputtering target, argon, nitrogen and oxygen gases as the sputtering gas, applying a power of 300 W across the MoSi target and a power of 1,700 W across the Si target, feeding argon gas at a flow rate of 18 sccm, nitrogen gas at a flow rate of 65 sccm, and oxygen gas at a flow rate of 15 sccm. The halftone phase shift film as deposited was measured for TIR. A TIR difference (ΔTIR) obtained by subtracting the TIR value as deposited from the TIR value measured prior to deposition (that is, of the quartz substrate) was −0.37 μm.

The transparent substrate having the halftone phase shift film deposited thereon was heat treated in a heating furnace at 300° C. for 6 hours. A TIR value after heat treatment was measured. A TIR difference (ΔTIR) obtained by subtracting the TIR value after heat treatment from the TIR value measured prior to deposition (that is, of the quartz substrate) was −0.32 μm.

As in Example 1, using a flash lamp annealing system LA3020F, the halftone phase shift film after heat treatment was subjected to pulse irradiation of IR-containing light under such conditions as to provide an irradiation energy dose of 29.1 J/cm$^2$ to complete a halftone phase shift photomask blank. The photomask blank was measured for a TIR value after pulse irradiation treatment. A TIR difference (ΔTIR) obtained by subtracting the TIR value after pulse irradiation treatment from the TIR value measured prior to deposition (that is, of the quartz substrate) was −0.32 μm.

The halftone phase shift film had a transmittance of 30% and a phase shift of 177° with respect to the exposure light, and a thickness of 114 nm. The halftone phase shift film had a molybdenum content of 3.5 at %, a silicon content of 33.6 at %, an oxygen content of 47.5 at %, and a nitrogen content of 15.4 at %. The deposition conditions, film composition, irradiation energy, ΔTIR, film thickness, transmittance, and phase shift are tabulated in Table 1.

A comparison of Example 1 with Comparative Example 1 reveals that the transmittance and phase shift are identical, the film thickness is substantially equal, but the halftone phase shift film of Example 1 is superior in all of the ΔTIR after deposition, the ΔTIR after heat treatment, and the ΔTIR after pulse irradiation treatment. It has been demonstrated that the halftone phase shift film of multilayer structure including a stress relaxation layer with a low oxygen content and a phase shift adjusting layer with a high oxygen content is effective as a high-transmittance halftone phase shift film for relieving film stress.

Example 2

In a chamber of a sputtering system, a 6025 quartz substrate of 152 mm squares and 6.35 mm thick was set. A halftone phase shift film of MoSiON was deposited on the substrate by using MoSi and Si targets as the sputtering target, argon, nitrogen and oxygen gases as the sputtering gas, applying a constant power of 300 W across the MoSi target and a constant power of 1,700 W across the Si target, feeding argon gas at a constant flow rate of 18 sccm, nitrogen gas at a constant flow rate of 65 sccm, and oxygen gas at different flow rates of 6, 1 and 5 sccm. The halftone phase shift film was of three-layer structure including a first phase shift adjusting layer (35 nm thick), a stress relaxation layer (11 nm thick), and a second phase shift adjusting layer (35 nm thick) stacked in order from the substrate side. The halftone phase shift film as deposited was measured for TIR. A ΔTIR obtained by subtracting the TIR value as deposited from the TIR value measured prior to deposition (that is, of the quartz substrate) was −0.16 μm.

The transparent substrate having the halftone phase shift film deposited thereon was heat treated in a heating furnace at 300° C. for 6 hours. A TIR value after heat treatment was measured. A ΔTIR obtained by subtracting the TIR value after heat treatment from the TIR value measured prior to deposition (that is, of the quartz substrate) was −0.11 μm.

As in Example 1, using a flash lamp annealing system LA3020F, the halftone phase shift film after heat treatment was subjected to pulse irradiation of IR-containing light under such conditions as to provide an irradiation energy dose of 29.1 J/cm$^2$ to complete a halftone phase shift photomask blank. The photomask blank was measured for a TIR value after pulse irradiation treatment. A ΔTIR obtained by subtracting the TIR value after pulse irradiation treatment from the TIR value measured prior to deposition (that is, of the quartz substrate) was −0.09 μm.

The halftone phase shift film had a transmittance of 15% and a phase shift of 180° with respect to the exposure light, and a thickness of 81 nm. The first phase shift adjusting layer had a molybdenum content of 4.5 at %, a silicon content of 37.0 at %, an oxygen content of 25.3 at %, and a nitrogen content of 33.2 at %; the stress relaxation layer had a molybdenum content of 5.2 at %, a silicon content of 39.9 at %, an oxygen content of 8.2 at %, and a nitrogen content of 46.7 at %; the second phase shift adjusting layer had a molybdenum content of 4.8 at %, a silicon content of 37.6 at %, an oxygen content of 21.0 at %, and a nitrogen content of 36.6 at %. The overall halftone phase shift film had on average a molybdenum content of 4.7 at %, a silicon content of 37.7 at %, an oxygen content of 21.1 at %, and a nitrogen content of 36.5 at %. The deposition conditions, film composition, irradiation energy, STIR, film thickness, transmittance, and phase shift are tabulated in Table 1.

Comparative Example 2

In a chamber of a sputtering system, a 6025 quartz substrate of 152 mm squares and 6.35 mm thick was set. A halftone phase shift film of MoSiON monolayer structure was deposited on the substrate by using MoSi and Si targets as the sputtering target, argon, nitrogen and oxygen gases as the sputtering gas, applying a power of 300 W across the MoSi target and a power of 1,700 W across the Si target, feeding argon gas at a flow rate of 18 sccm, nitrogen gas at a flow rate of 65 sccm, and oxygen gas at a flow rate of 6.5 sccm. The halftone phase shift film as deposited was measured for TIR. A ΔTIR obtained by subtracting the TIR value as deposited from the TIR value measured prior to deposition (that is, of the quartz substrate) was −0.21 μm.

The transparent substrate having the halftone phase shift film deposited thereon was heat treated in a heating furnace at 300° C. for 6 hours. A TIR value after heat treatment was measured. A ΔTIR obtained by subtracting the TIR value after heat treatment from the TIR value measured prior to deposition (that is, of the quartz substrate) was −0.15 μm.

As in Example 1, using a flash lamp annealing system LA3020F, the halftone phase shift film after heat treatment was subjected to pulse irradiation of IR-containing light under such conditions as to provide an irradiation energy dose of 29.1 J/cm$^2$ to complete a halftone phase shift photomask blank. The photomask blank was measured for a TIR value after pulse irradiation treatment. A ΔTIR obtained by subtracting the TIR value after pulse irradiation treatment from the TIR value measured prior to deposition (that is, of the quartz substrate) was −0.14 μm.

The halftone phase shift film had a transmittance of 15% and a phase shift of 180° with respect to the exposure light, and a thickness of 81 nm. The halftone phase shift film had a molybdenum content of 4.8 at %, a silicon content of 37.8 at %, an oxygen content of 21.1 at %, and a nitrogen content of 36.3 at %. The deposition conditions, film composition, irradiation energy, ΔTIR, film thickness, transmittance, and phase shift are tabulated in Table 1.

A comparison of Example 2 with Comparative Example 2 reveals that the transmittance, phase shift and film thickness are identical, but the halftone phase shift film of Example 2 is superior in all of the ΔTIR after deposition, the ΔTIR after heat treatment, and the ΔTIR after pulse irradiation treatment. It has been demonstrated that the halftone phase shift film of multilayer structure including a stress relaxation layer with a low oxygen content and a phase shift adjusting layer with a high oxygen content is effective as a high-transmittance halftone phase shift film for relieving film stress.

Example 3

In a chamber of a sputtering system, a 6025 quartz substrate of 152 mm squares and 6.35 mm thick was set. A halftone phase shift film of MoSiON was deposited on the substrate by using MoSi and Si targets as the sputtering target, argon, nitrogen and oxygen gases as the sputtering gas, applying a constant power of 300 W across the MoSi target and a constant power of 1,700 W across the Si target, feeding argon gas at a constant flow rate of 18 sccm, nitrogen gas at a constant flow rate of 58 sccm, and oxygen gas at different flow rates of 3.5 and 4.5 sccm. The halftone phase shift film was of two-layer structure including a stress relaxation layer (37 nm thick) and a phase shift adjusting layer (38 nm thick) stacked in order from the substrate side. The halftone phase shift film as deposited was measured for TIR. A ΔTIR obtained by subtracting the TIR value as deposited from the TIR value measured prior to deposition (that is, of the quartz substrate) was −0.23 μm.

The transparent substrate having the halftone phase shift film deposited thereon was heat treated in a heating furnace at 300° C. for 6 hours. A TIR value after heat treatment was measured. A ΔTIR obtained by subtracting the TIR value after heat treatment from the TIR value measured prior to deposition (that is, of the quartz substrate) was −0.18 μm.

As in Example 1, using a flash lamp annealing system LA3020F, the halftone phase shift film after heat treatment was subjected to pulse irradiation of IR-containing light under such conditions as to provide an irradiation energy dose of 26.8 J/cm$^2$ to complete a halftone phase shift photomask blank. The photomask blank was measured for a TIR value after pulse irradiation treatment. A ΔTIR obtained by subtracting the TIR value after pulse irradiation treatment from the TIR value measured prior to deposition (that is, of the quartz substrate) was +0.01 μm.

The halftone phase shift film had a transmittance of 12% and a phase shift of 177° with respect to the exposure light, and a thickness of 75 nm. The stress relaxation layer had a molybdenum content of 5.0 at %, a silicon content of 38.2 at %, an oxygen content of 13.8 at %, and a nitrogen content of 43.0 at %; and the phase shift adjusting layer had a molybdenum content of 5.4 at %, a silicon content of 38.2 at %, an oxygen content of 15.8 at %, and a nitrogen content of 40.6 at %. The overall halftone phase shift film had on average a molybdenum content of 5.2 at %, a silicon content of 38.2 at %, an oxygen content of 14.9 at %, and a nitrogen content of 41.7 at %. The deposition conditions, film composition, irradiation energy, ΔTIR, film thickness, transmittance, and phase shift are tabulated in Table 1.

Comparative Example 3

In a chamber of a sputtering system, a 6025 quartz substrate of 152 mm squares and 6.35 mm thick was set. A halftone phase shift film of MoSiON monolayer structure was deposited on the substrate by using MoSi and Si targets as the sputtering target, argon, nitrogen and oxygen gases as the sputtering gas, applying a power of 300 W across the MoSi target and a power of 1,700 W across the Si target, feeding argon gas at a flow rate of 18 sccm, nitrogen gas at a flow rate of 58 sccm, and oxygen gas at a flow rate of 4.2 sccm. The halftone phase shift film as deposited was measured for TIR. A ΔTIR obtained by subtracting the TIR value as deposited from the TIR value measured prior to deposition (that is, of the quartz substrate) was −0.25 μm.

The transparent substrate having the halftone phase shift film deposited thereon was heat treated in a heating furnace at 300° C. for 6 hours. A TIR value after heat treatment was measured. A ΔTIR obtained by subtracting the TIR value after heat treatment from the TIR value measured prior to deposition (that is, of the quartz substrate) was −0.20 μm.

As in Example 1, using a flash lamp annealing system LA3020F, the halftone phase shift film after heat treatment was subjected to pulse irradiation of IR-containing light under such conditions as to provide an irradiation energy dose of 26.8 J/cm$^2$ to complete a halftone phase shift photomask blank. The photomask blank was measured for a TIR value after pulse irradiation treatment. A ΔTIR obtained by subtracting the TIR value after pulse irradiation treatment from the TIR value measured prior to deposition (that is, of the quartz substrate) was −0.03 μm.

The halftone phase shift film had a transmittance of 12% and a phase shift of 177° with respect to the exposure light, and a thickness of 75 nm. The halftone phase shift film had a molybdenum content of 5.3 at %, a silicon content of 38.3 at %, an oxygen content of 15.6 at %, and a nitrogen content of 40.8 at %. The deposition conditions, film composition, irradiation energy, ΔTIR, film thickness, transmittance, and phase shift are tabulated in Table 1.

A comparison of Example 3 with Comparative Example 3 reveals that the transmittance, phase shift and film thickness are identical, but the halftone phase shift film of Example 3 is superior in all of the STIR after deposition, the ΔTIR after heat treatment, and the ΔTIR after pulse irradiation treatment. It has been demonstrated that the halftone phase shift film of multilayer structure including a stress relaxation layer with a low oxygen content and a phase shift adjusting layer with a high oxygen content is effective as a high-transmittance halftone phase shift film for relieving film stress. As a result of pulse irradiation of IR-containing light, the film stress is relieved with a less dose of irradiation energy. Example 3 is especially effective for relieving film stress.

Example 4

In a chamber of a sputtering system, a 6025 quartz substrate of 152 mm squares and 6.35 mm thick was set. A halftone phase shift film of MoSiON was deposited on the substrate by using MoSi and Si targets as the sputtering target, argon, nitrogen and oxygen gases as the sputtering gas, applying a constant power of 400 W across the MoSi target and a constant power of 1,600 W across the Si target, feeding argon gas at a constant flow rate of 17 sccm, nitrogen gas at a constant flow rate of 55 sccm, and oxygen gas at different flow rates of 3.6 and 4.6 sccm. The halftone phase shift film was of two-layer structure including a stress relaxation layer (21 nm thick) and a phase shift adjusting layer (54 nm thick) stacked in order from the substrate side. The halftone phase shift film as deposited was measured for TIR. A STIR obtained by subtracting the TIR value as deposited from the TIR value measured prior to deposition (that is, of the quartz substrate) was −0.28 µm.

The transparent substrate having the halftone phase shift film deposited thereon was heat treated in a heating furnace at 300° C. for 6 hours. A TIR value after heat treatment was measured. A ΔTIR obtained by subtracting the TIR value after heat treatment from the TIR value measured prior to deposition (that is, of the quartz substrate) was −0.21 µm.

As in Example 1, using a flash lamp annealing system LA3020F, the halftone phase shift film after heat treatment was subjected to pulse irradiation of IR-containing light under such conditions as to provide an irradiation energy dose of 23.4 J/cm² to complete a halftone phase shift photomask blank. The photomask blank was measured for a TIR value after pulse irradiation treatment. A ΔTIR obtained by subtracting the TIR value after pulse irradiation treatment from the TIR value measured prior to deposition (that is, of the quartz substrate) was +0.01 µm.

The halftone phase shift film had a transmittance of 9% and a phase shift of 177° with respect to the exposure light, and a thickness of 75 nm. The stress relaxation layer had a molybdenum content of 6.3 at %, a silicon content of 38.3 at %, an oxygen content of 13.0 at %, and a nitrogen content of 42.4 at %; and the phase shift adjusting layer had a molybdenum content of 7.0 at %, a silicon content of 38.2 at %, an oxygen content of 15.0 at %, and a nitrogen content of 39.8 at %. The overall halftone phase shift film had on average a molybdenum content of 6.8 at %, a silicon content of 38.3 at %, an oxygen content of 14.2 at %, and a nitrogen content of 40.7 at %. The deposition conditions, film composition, irradiation energy, ΔTIR, film thickness, transmittance, and phase shift are tabulated in Table 1.

Comparative Example 4

In a chamber of a sputtering system, a 6025 quartz substrate of 152 mm squares and 6.35 mm thick was set. A halftone phase shift film of MoSiON monolayer structure was deposited on the substrate by using MoSi and Si targets as the sputtering target, argon, nitrogen and oxygen gases as the sputtering gas, applying a power of 400 W across the MoSi target and a power of 1,600 W across the Si target, feeding argon gas at a flow rate of 17 sccm, nitrogen gas at a flow rate of 55 sccm, and oxygen gas at a flow rate of 4.4 sccm. The halftone phase shift film as deposited was measured for TIR. A ΔTIR obtained by subtracting the TIR value as deposited from the TIR value measured prior to deposition (that is, of the quartz substrate) was −0.31 µm.

The transparent substrate having the halftone phase shift film deposited thereon was heat treated in a heating furnace at 300° C. for 6 hours. A TIR value after heat treatment was measured. A ΔTIR obtained by subtracting the TIR value after heat treatment from the TIR value measured prior to deposition (that is, of the quartz substrate) was −0.24 µm.

As in Example 1, using a flash lamp annealing system LA3020F, the halftone phase shift film after heat treatment was subjected to pulse irradiation of IR-containing light under such conditions as to provide an irradiation energy dose of 23.4 J/cm² to complete a halftone phase shift photomask blank. The photomask blank was measured for a TIR value after pulse irradiation treatment. A ΔTIR obtained by subtracting the TIR value after pulse irradiation treatment from the TIR value measured prior to deposition (that is, of the quartz substrate) was −0.04 µm.

The halftone phase shift film had a transmittance of 9% and a phase shift of 177° with respect to the exposure light, and a thickness of 75 nm. The halftone phase shift film had a molybdenum content of 6.8 at %, a silicon content of 37.2 at %, an oxygen content of 14.3 at %, and a nitrogen content of 41.7 at %. The deposition conditions, film composition, irradiation energy, ΔTIR, film thickness, transmittance, and phase shift are tabulated in Table 1.

A comparison of Example 4 with Comparative Example 4 reveals that the transmittance, phase shift and film thickness are identical, but the halftone phase shift film of Example 4 is superior in all of the ΔTIR after deposition, the ΔTIR after heat treatment, and the ΔTIR after pulse irradiation treatment. It has been demonstrated that the halftone phase shift film of multilayer structure including a stress relaxation layer with a low oxygen content and a phase shift adjusting layer with a high oxygen content is effective as a high-transmittance halftone phase shift film for relieving film stress. As a result of pulse irradiation of IR-containing light, the film stress is relieved with a less dose of irradiation energy. Example 4 is especially effective for relieving film stress.

TABLE 1

| | Applied power (W) | | Flow rate (sccm) | | | Composition (at %) | | | | Irradiation energy dose (J/cm²) | ΔTIR (µm) | | | Film thickness (nm) | Transmittance (%) | Phase shift (°) |
|---|---|---|---|---|---|---|---|---|---|---|---|---|---|---|---|---|
| | MoSi | Si | Ar | N₂ | O₂ | Mo | Si | O | N | | after deposition | after heat treatment | after irradiation treatment | | | |
| Example 1 | 300 | 1700 | 18 | 65 | 6.6 | 4.2 | 35.9 | 31.8 | 28.1 | | | | | 28 | | |
| | | | | | 13.6 | 3.5 | 32.6 | 49.1 | 14.8 | | | | | 43 | | |
| | | | | | 17.6 | 3.2 | 31.5 | 57.1 | 8.2 | | | | | 42 | | |
| | | overall film | | | | 3.6 | 33.0 | 47.8 | 15.6 | 29.1 | −0.30 | −0.25 | −0.24 | 113 | 30 | 177 |

TABLE 1-continued

| | Applied power (W) | | Flow rate (sccm) | | | Composition (at %) | | | | Irradiation energy dose (J/cm²) | ΔTIR (μm) | | | Film thickness (nm) | Transmittance (%) | Phase shift (°) |
|---|---|---|---|---|---|---|---|---|---|---|---|---|---|---|---|---|
| | MoSi | Si | Ar | N₂ | O₂ | Mo | Si | O | N | | after deposition | after heat treatment | after irradiation treatment | | | |
| Comparative Example 1 | 300 | 1700 | 18 | 65 | 15 | 3.5 | 33.6 | 47.5 | 15.4 | 29.1 | −0.37 | −0.32 | −0.32 | 114 | 30 | 177 |
| Example 2 | 300 | 1700 | 18 | 65 | 6 | 4.5 | 37.0 | 25.3 | 33.2 | | | | | 35 | | |
| | | | | | 1 | 5.2 | 39.9 | 8.2 | 46.7 | | | | | 11 | | |
| | | | | | 5 | 4.8 | 37.6 | 21.0 | 36.6 | | | | | 35 | | |
| | overall film | | | | | 4.7 | 37.7 | 21.1 | 36.5 | 29.1 | −0.16 | −0.11 | −0.09 | 81 | 15 | 180 |
| Comparative Example 2 | 300 | 1700 | 18 | 65 | 6.5 | 4.8 | 37.8 | 21.1 | 36.3 | 29.1 | −0.21 | −0.15 | −0.14 | 81 | 15 | 180 |
| Example 3 | 300 | 1700 | 18 | 58 | 3.5 | 5.0 | 38.2 | 13.8 | 43.0 | | | | | 37 | | |
| | | | | | 4.5 | 5.4 | 38.2 | 15.8 | 40.6 | | | | | 38 | | |
| | overall film | | | | | 5.2 | 38.2 | 14.9 | 41.7 | 26.8 | −0.23 | −0.18 | +0.01 | 75 | 12 | 177 |
| Comparative Example 3 | 300 | 1700 | 18 | 58 | 4.2 | 5.3 | 38.3 | 15.6 | 40.8 | 26.8 | −0.25 | −0.20 | −0.03 | 75 | 12 | 177 |
| Example 4 | 400 | 1600 | 17 | 55 | 3.6 | 6.3 | 38.3 | 13.0 | 42.4 | | | | | 21 | | |
| | | | | | 4.6 | 7.0 | 38.2 | 15.0 | 39.8 | | | | | 54 | | |
| | overall film | | | | | 6.8 | 38.3 | 14.2 | 40.7 | 23.4 | −0.28 | −0.21 | +0.01 | 75 | 9 | 177 |
| Comparative Example 4 | 400 | 1600 | 17 | 55 | 4.4 | 6.8 | 37.2 | 14.3 | 41.7 | 23.4 | −0.31 | −0.24 | −0.04 | 75 | 9 | 177 |

Japanese Patent Application Nos. 2015-170367 and 2016-116794 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift photomask blank comprising a transparent substrate and a halftone phase shift film thereon providing a phase shift of 150° to 200° and a transmittance of 9% to 40% with respect to light of wavelength up to 200 nm, wherein
said halftone phase shift film consists of a transition metal, silicon, oxygen and nitrogen, has an average transition metal content of at least 3 at %, and is composed of a plurality of layers including at least one stress relaxation layer consisting of the transition metal, silicon, oxygen and nitrogen and at least one phase shift adjusting layer consisting of the transition metal, silicon, oxygen and nitrogen,
said stress relaxation layer has an oxygen content of at least 3 at % which is the lowest,
said phase shift adjusting layer has an oxygen content of at least 5 at % which is at least 2 at % higher than the oxygen content of the stress relaxation layer.

2. The photomask blank of claim 1 wherein said halftone phase shift film is formed contiguous to the transparent substrate.

3. The photomask blank of claim 2 wherein a layer disposed closest to the transparent substrate is the stress relaxation layer.

4. The photomask blank of claim 1 wherein said halftone phase shift film consists of at least three layers, and each of the phase shift adjusting layers is disposed contiguous to any stress relaxation layer.

5. The photomask blank of claim 1 wherein the transition metal content is in a range of 5 at % to 10 at %.

6. The photomask blank of claim 1 wherein the transition metal is molybdenum.

7. The photomask blank of claim 1 wherein the halftone phase shift film has a transmittance of 9% to 12%.

8. The photomask blank of claim 1 wherein the halftone phase shift film has a transmittance of 15% to 30%.

9. The photomask blank of claim 1 which is processed into a halftone phase shift photomask, the photomask being suited for use in photolithography for forming a pattern with a half pitch of up to 50 nm on a processable substrate, and in the patternwise exposure step for transferring the pattern to a photoresist film formed on the processable substrate using exposure light of wavelength up to 200 nm.

10. A method for preparing a halftone phase shift photomask blank comprising a transparent substrate and a halftone phase shift film thereon providing a phase shift of 150° to 200° and a transmittance of 9% to 40% with respect to light of wavelength up to 200 nm,
said method comprising the step of forming a halftone phase shift film on the transparent substrate, said halftone phase shift film consisting of a transition metal, silicon, oxygen and nitrogen, having an average transition metal content of at least 3 at %, and being composed of a plurality of layers including at least one stress relaxation layer consisting of the transition metal, silicon, oxygen and nitrogen and at least one phase shift adjusting layer consisting of the transition metal, silicon, oxygen and nitrogen, said stress relaxation layer having an oxygen content of at least 3 at % which is the lowest, said phase shift adjusting layer having an oxygen content of at least 5 at % which is at least 2 at % higher than the oxygen content of the stress relaxation layer.

11. The method of claim 10 wherein the halftone phase shift film has a transmittance of 9% to 12%, and the method further includes the step of irradiating pulse of infrared-containing light to the halftone phase shift film on the substrate.

12. The method of claim 11, further comprising the step of heat treating the halftone phase shift film on the substrate by holding at 250 to 600° C. for at least 2 hours prior to the step of pulse irradiation of infrared-containing light.

13. The method of claim 10 wherein the halftone phase shift film has a transmittance of 15% to 30%, and the method further includes the step of heat treating the halftone phase shift film on the substrate by holding at 250 to 600° C. for at least 2 hours, but not the step of pulse irradiation of infrared-containing light.

14. A halftone phase shift photomask comprising a transparent substrate and a halftone phase shift film thereon providing a phase shift of 150° to 200° and a transmittance of 9% to 40% with respect to light of wavelength up to 200 nm, wherein said halftone phase shift film consists of a transition metal, silicon, oxygen and nitrogen, has an average transition metal content of at least 3 at %, and is composed of a plurality of layers including at least one stress relaxation layer consisting of the transition metal, silicon, oxygen and nitrogen and at least one phase shift adjusting layer consisting of the transition metal, silicon, oxygen and nitrogen, the stress relaxation layer has an oxygen content of at least 3 at % which is the lowest, the phase shift adjusting layer has an oxygen content of at least 5 at % which is at least 2 at % higher than the oxygen content of the stress relaxation layer.

\* \* \* \* \*